(12) United States Patent
Fong et al.

(10) Patent No.: US 9,318,306 B2
(45) Date of Patent: Apr. 19, 2016

(54) INTERCHANGEABLE SPUTTER GUN HEAD

(71) Applicant: Intermolecular, Inc., San Jose, CA (US)

(72) Inventors: Owen Fong, San Jose, CA (US);
Timothy Franklin, Campbell, CA (US);
Stephen Charles Garner, Newark, CA (US); James Tsung, Milpitas, CA (US)

(73) Assignee: Intermolecular, Inc., San Jose, CA (US)

( * ) Notice: Subject to any disclaimer, the term of this patent is extended or adjusted under 35 U.S.C. 154(b) by 200 days.

(21) Appl. No.: 14/137,807

(22) Filed: Dec. 20, 2013

(65) Prior Publication Data
US 2015/0176117 A1 Jun. 25, 2015

(51) Int. Cl.
| | | |
|---|---|---|
| C23C 14/34 | (2006.01) | |
| H01J 37/34 | (2006.01) | |
| H01J 37/32 | (2006.01) | |
| C23C 14/04 | (2006.01) | |
| C23C 14/35 | (2006.01) | |
| C23C 14/58 | (2006.01) | |

(52) U.S. Cl.
CPC ............... *H01J 37/34* (2013.01); *C23C 14/04* (2013.01); *C23C 14/3407* (2013.01); *C23C 14/3442* (2013.01); *C23C 14/351* (2013.01); *C23C 14/352* (2013.01); *C23C 14/5826* (2013.01); *C23C 14/5833* (2013.01); *C23C 14/5846* (2013.01); *H01J 37/32* (2013.01); *H01J 37/32798* (2013.01); *H01J 37/32935* (2013.01); *B01J 2219/0043* (2013.01); *B01J 2219/00443* (2013.01); *B01J 2219/00745* (2013.01); *B01J 2219/00756* (2013.01); *H01J 2237/332* (2013.01)

(58) Field of Classification Search
CPC  C23C 14/04; C23C 14/3407; C23C 14/3442; C23C 14/351; C23C 14/352; C23C 14/5826; C23C 14/5833; C23C 14/5846; H01J 37/32; H01J 37/32798; H01J 37/32935; H01J 37/34; H01J 2237/332; C40B 60/00
USPC ........................................ 204/192.12, 298.26
See application file for complete search history.

(56) References Cited

U.S. PATENT DOCUMENTS

| | | | | |
|---|---|---|---|---|
| 4,434,402 | A * | 2/1984 | Lane | F02P 15/003 324/122 |
| 4,904,362 | A | 2/1990 | Gaertner et al. | |
| 4,911,810 | A | 3/1990 | Lauro et al. | |
| 5,122,252 | A * | 6/1992 | Latz | C23C 14/0052 204/192.12 |
| 6,905,578 | B1 * | 6/2005 | Moslehi | C23C 14/568 118/719 |
| 7,713,390 | B2 | 5/2010 | Golubovsky | |
| 7,867,904 | B2 | 1/2011 | Chiang et al. | |
| 8,084,400 | B2 | 12/2011 | Chiang et al. | |
| 2003/0038023 | A1 * | 2/2003 | Ramberg | C23C 14/3442 204/192.2 |
| 2006/0254904 | A1 | 11/2006 | Golubovsky | |
| 2009/0061108 | A1 | 3/2009 | Endo et al. | |
| 2013/0017316 | A1 | 1/2013 | Yang et al. | |

* cited by examiner

Primary Examiner — Rodney McDonald

(57) ABSTRACT

In some embodiments, apparatus are provided that provide for flexible processing in both high productivity combinatorial (HPC) and full wafer modes. The apparatus allow for interchangeable functionality that includes deposition with different sizes of targets, plasma treatment, ion beam treatment, and in-situ metrology. The functional modules are designed so that the modules may be interchanged with minimal effort and reduced system downtime.

12 Claims, 10 Drawing Sheets

| | Process Head Position #1 | Process Head Position #2 | Process Head Position #3 | Process Head Position #4 |
|---|---|---|---|---|
| Configuration #1 | PVD | PVD | PVD | PVD |
| Configuration #2 | PVD | PVD | PVD | Plasma Treatment |
| Configuration #3 | PVD | PVD | Ion Beam Treatment | Plasma Treatment |
| Configuration #4 | PVD | In-situ Metrology | Ion Beam Treatment | Plasma Treatment |
| Configuration #5 | PVD | PVD | PVD | Ion Beam Treatment |
| Configuration #6 | PVD | PVD | In-situ Metrology | Plasma Treatment |
| Configuration #7 | PVD | PVD | In-situ Metrology | Ion Beam Treatment |
| Configuration #8 | PVD | PVD | PVD | In-situ Metrology |

| | Process Head Position #1 | Process Head Position #2 | Process Head Position #3 | Process Head Position #4 |
|---|---|---|---|---|
| Configuration #1 | PVD | PVD | PVD | PVD |
| Configuration #2 | PVD | PVD | PVD | Plasma Treatment |
| Configuration #3 | PVD | PVD | Ion Beam Treatment | Plasma Treatment |
| Configuration #4 | PVD | In-situ Metrology | Ion Beam Treatment | Plasma Treatment |
| Configuration #5 | PVD | PVD | PVD | Ion Beam Treatment |
| Configuration #6 | PVD | PVD | In-situ Metrology | Plasma Treatment |
| Configuration #7 | PVD | PVD | In-situ Metrology | Ion Beam Treatment |
| Configuration #8 | PVD | PVD | PVD | In-situ Metrology |

FIG. 8

INTERCHANGEABLE SPUTTER GUN HEAD

TECHNICAL FIELD

The present disclosure relates generally to semiconductor manufacturing and in particular to sputter deposition and plasma treatment in a deposition chamber configured for both full wafer and combinatorial processing.

BACKGROUND

Plasma processing or manufacturing techniques are used in the manufacture of integrated circuits (IC) semiconductor devices, flat panel displays, optoelectronics devices, data storage devices, magneto electronic devices, magneto optic devices, packaged devices, and the like.

Deposition processes are commonly used in semiconductor manufacturing to deposit a layer of material onto a substrate. Physical vapor deposition (PVD) is one example of a deposition process, and sputter deposition or sputtering is a common physical vapor deposition method. In sputtering, ions or neutral species are ejected from a target material by high-energy particle bombardment and then deposited onto the substrate using plasma. In some process sequences, it may be desirable to expose the surface to a plasma pre-treatment step before or after the sputter deposition. For site isolated deposition (i.e., deposition on a site isolated region of the substrate), PVD tools typically include an aperture through which the sputtered ions are targeted. While PVD tools are commonly used in the industry, they are limited to performing specific processes and do not permit much flexibility. In some process sequences, it may be desirable to have the capability to perform analysis or characterization of the layers or treated surfaces in-situ (e.g. within the same processing chamber).

As feature sizes continue to shrink on semiconductor devices, improvements, whether in materials, unit processes, or process sequences, are continually being sought in these semiconductor processes. In order to identify different materials, evaluate different unit process conditions or parameters, or evaluate different sequencing and integration of processes, and combinations thereof, it is desirable to process isolated regions of the substrate using different process conditions to improve the efficiency of research and development. This capability is called "combinatorial processing", and it is generally not performed with tools that are designed specifically for conventional full substrate processing. It is also desirable to subject isolated regions of the substrate to different processing conditions (e.g., localized deposition) in one step of a sequence followed by subjecting the full substrate to a similar processing condition (e.g., full substrate deposition) in another step.

Further developments and improvements, particularly innovations that enable flexibility and increased throughput, and provide combinatorial processing, in semiconductor manufacturing are needed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, apparatus are provided that provide for flexible processing in both high productivity combinatorial (HPC) and full wafer modes. The apparatus allow for interchangeable functionality that includes deposition with different sizes of targets, plasma treatment, ion beam treatment, and in-situ metrology. The functional modules are designed so that the modules may be interchanged with minimal effort and reduced system downtime.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

FIG. 8 presents a table of possible hardware configurations according to some embodiments.

DETAILED DESCRIPTION

Figure 1:
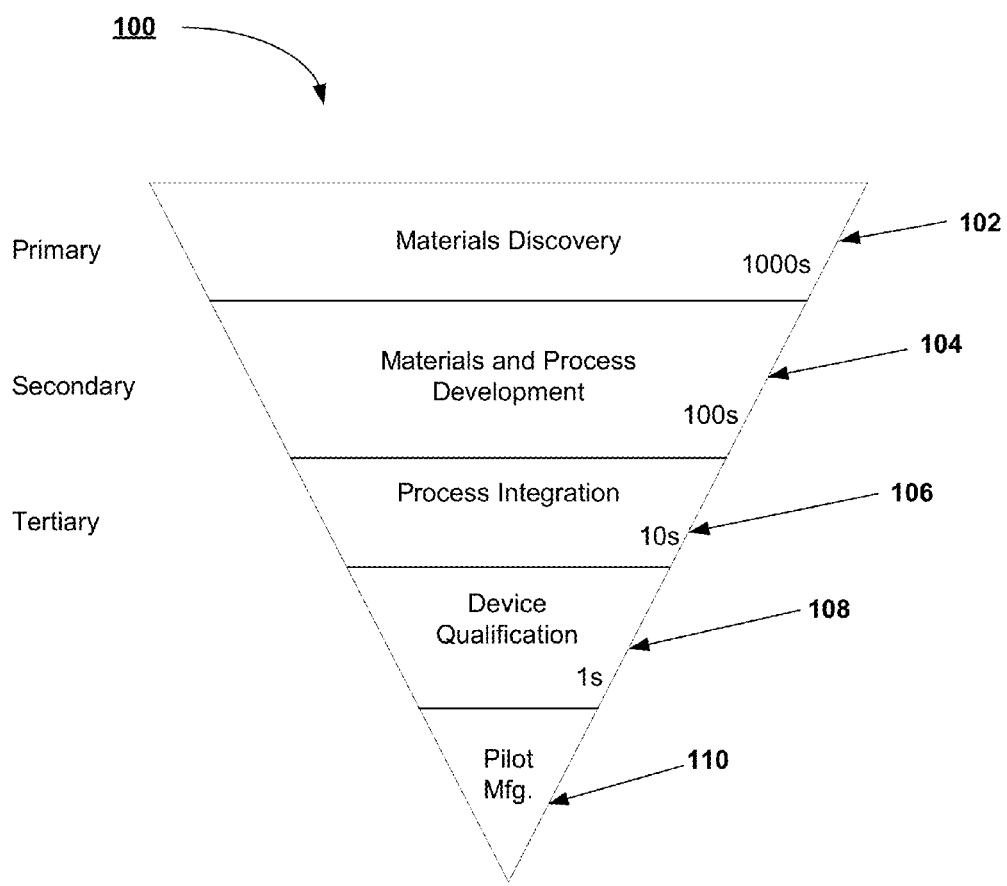
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, the phrase "site-isolated region" (SIR) will be understood to refer to one or more regions on a substrate that are separated and used for the evaluation of different materials or process parameters. The SIRs can be formed using many different methods such as scribing, deposition through a shadow mask, deposition using isolated deposition heads, lithography, and the like. The present disclosure is not limited by the method used to form the SIRs.

As used herein, the phrase "substrate" will be understood to refer to any conventional round 200 mm, 300 mm, 450 mm, or any other larger or smaller substrate/wafer size. In some embodiments, "substrate" may refer to a square, rectangular, or other shaped substrate. One skilled in the art will appreciate that the "substrate" may be a blanket substrate, a coupon (e.g., partial wafer), or even a patterned substrate having predefined regions.

As used herein, the phrases "sputter gun" and "deposition head" will be understood to be equivalent and will be used interchangeably. These phrases will be used to describe the hardware, assembly, and apparatus used to perform PVD (e.g. sputtering) within a process chamber.

As used herein, the phrase "process head" will be understood to describe a generic apparatus that may have any one of a number of processing functionalities. Examples of suitable processing functionalities include PVD (e.g. sputter deposition), plasma treatment, ion beam treatment, and in-situ metrology.

The manufacture of semiconductor devices entails the integration and sequencing of many unit processing steps. As an example, semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009, the entireties of which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005, the entireties of which are all herein incorporated by reference.

HPC processing techniques have been successfully adapted to wet chemical processing such as etching, texturing, polishing, cleaning, etc. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

Figure 2:
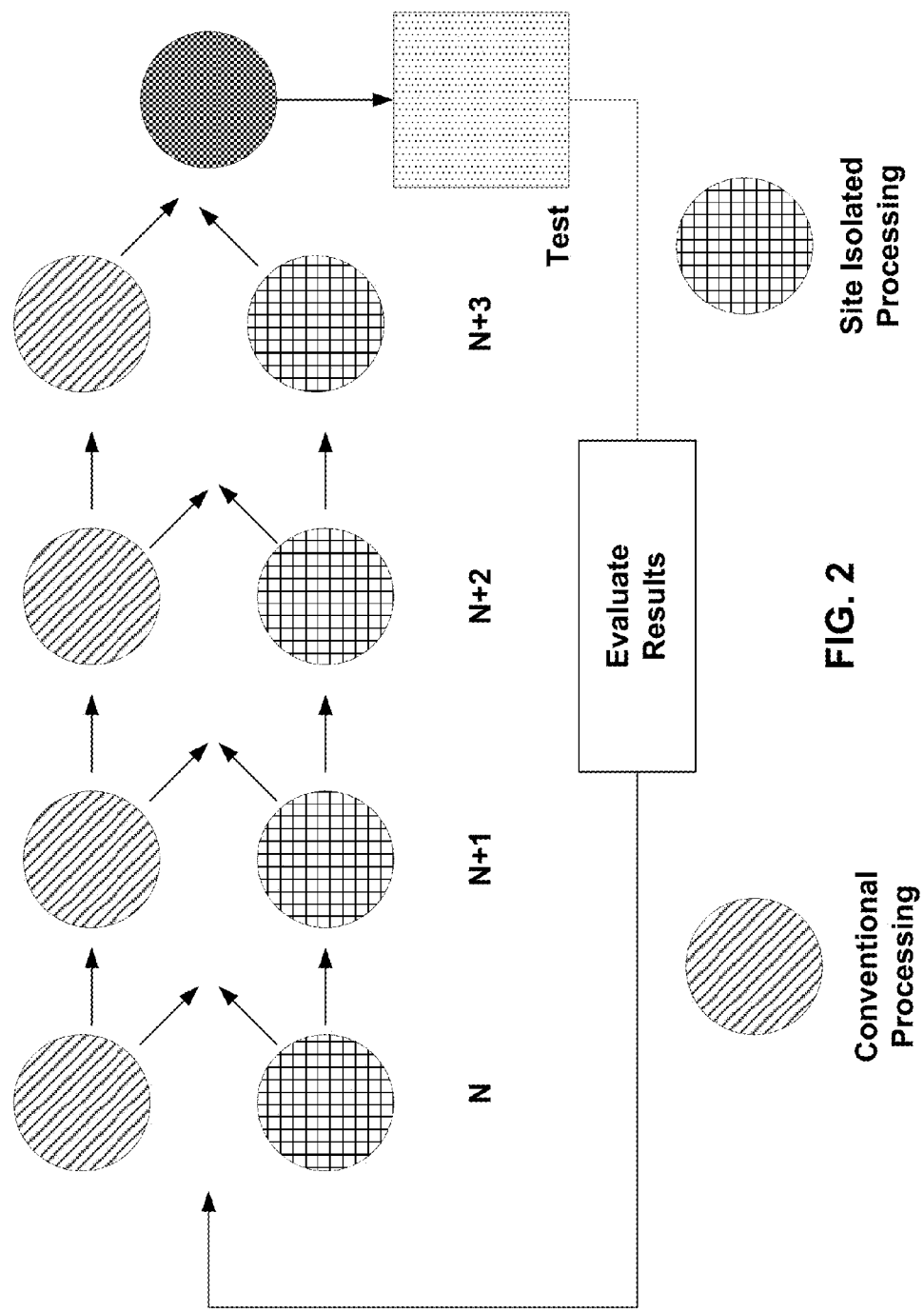
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It will be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It will be appreciated that these process parameters are exemplary and not meant to be an exhaustive list as other process parameters commonly used in semiconductor manufacturing may be varied.

Figure 3:
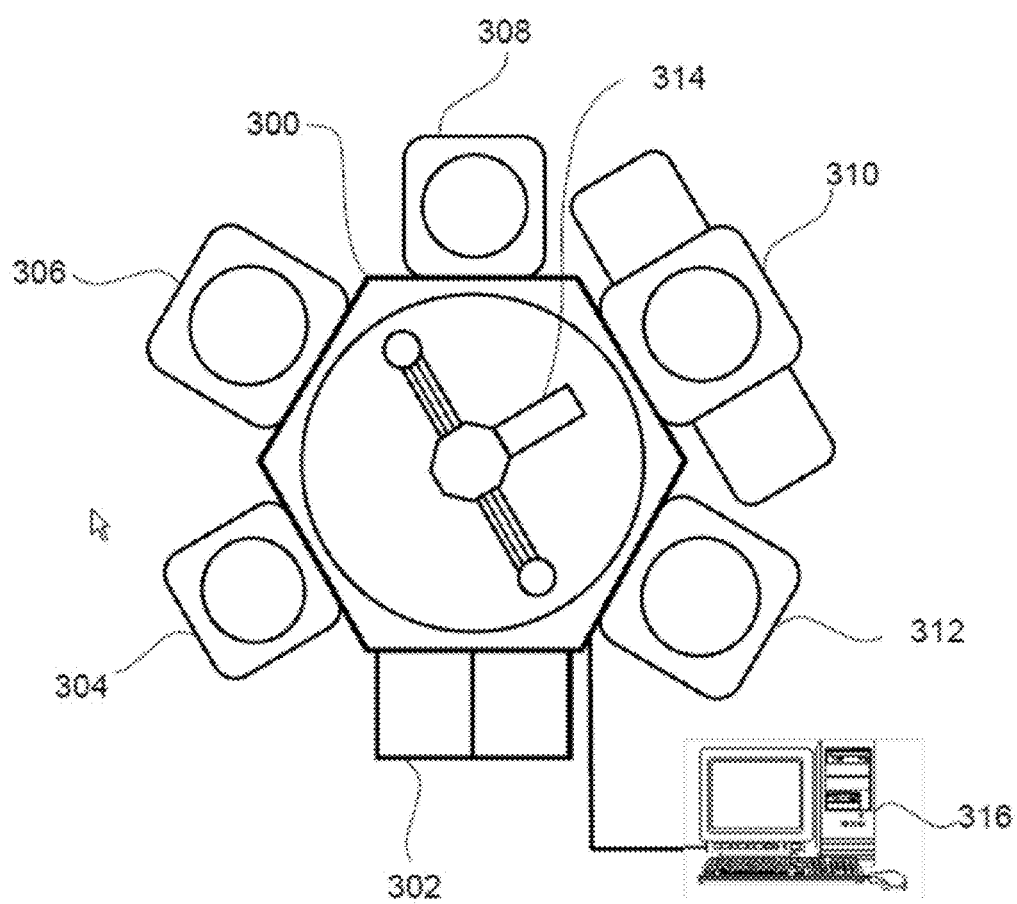
FIG. 3 is a simplified schematic diagram illustrating an integrated high productivity combinatorial (HPC) system.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

In some embodiments, a process chamber for combinatorial processing of a substrate is provided that includes one or more assemblies for sputtering material from targets (such as sputter guns); a power source coupled to the one or more sputter guns; a substrate support; a power source (e.g. RF, DC, pulsed, or the like) coupled to the substrate support; and a grounded shield comprising an aperture disposed between the substrate support and the one or more sputter guns to form a dark-space gap between the substrate support and the aperture. The aperture may be configured to allow sputter deposition or plasma processing of a site-isolated region on the substrate.

The process chamber may further include a plasma confinement ring between the substrate support and the grounded shield. The plasma confinement ring may be thicker than the substrate. The plasma confinement ring fills the dark-space gap between the substrate support and the grounded shield.

The process chamber may further include a dielectric material in the dark-space gap. The dielectric material may be coated with a metal layer for grounding and RF shielding. The dark-space gap may be between about 1 mm and about 3 mm.

The process chamber may further include a controller to selectively apply power to the one or more sputter guns from the power source and apply power to bias the substrate support from a power source. The controller may be configured to control the power source to perform one or both of plasma processing and PVD deposition on a site-isolated region on the substrate. In some embodiments, other sputter mechanisms can be used instead of the sputter guns.

In some embodiments, a semiconductor processing system for combinatorial processing of a substrate is provided that includes a process chamber having a dark-space region configured to prevent plasma leaks in a region adjacent the substrate. The process chamber can be configured to perform both plasma processing and sputter deposition on a site-isolated region on the substrate. The process chamber may include a dielectric material in the dark-space gap. The dark-space region may be between about 1 mm and about 3 mm.

The process chamber may include a plasma confinement ring positioned around the substrate to prevent plasma leak in a region adjacent the substrate. The plasma confinement ring may be thicker than the substrate. The plasma confinement ring may be a conductive material or ceramic material which may or may not be partially coated with a metal layer.

In some embodiments, a method of combinatorial processing of a substrate is provided in which site-isolated sputter deposition and plasma processing are performed in the same process chamber. The site-isolated sputter deposition may include site-isolated co-sputtering deposition. Cleaning, site-isolated sputter deposition, and plasma processing may be performed in the same process chamber. Cleaning, site-isolated sputter deposition, and plasma processing, and full wafer sputter deposition may be performed in the same process chamber.

In some embodiments, a method of combinatorial processing of a substrate is provided in which sputter deposition and plasma processing are performed in the same process chamber. The sputter deposition may include co-sputtering deposition. Cleaning, sputter deposition, and plasma processing may be performed in the same process chamber. The sputter deposition may result in a gradient in material properties across the length and/or width of the substrate. Physical methods such as scribing or lithography may be used to define the SIRs after the deposition.

Figure 4:
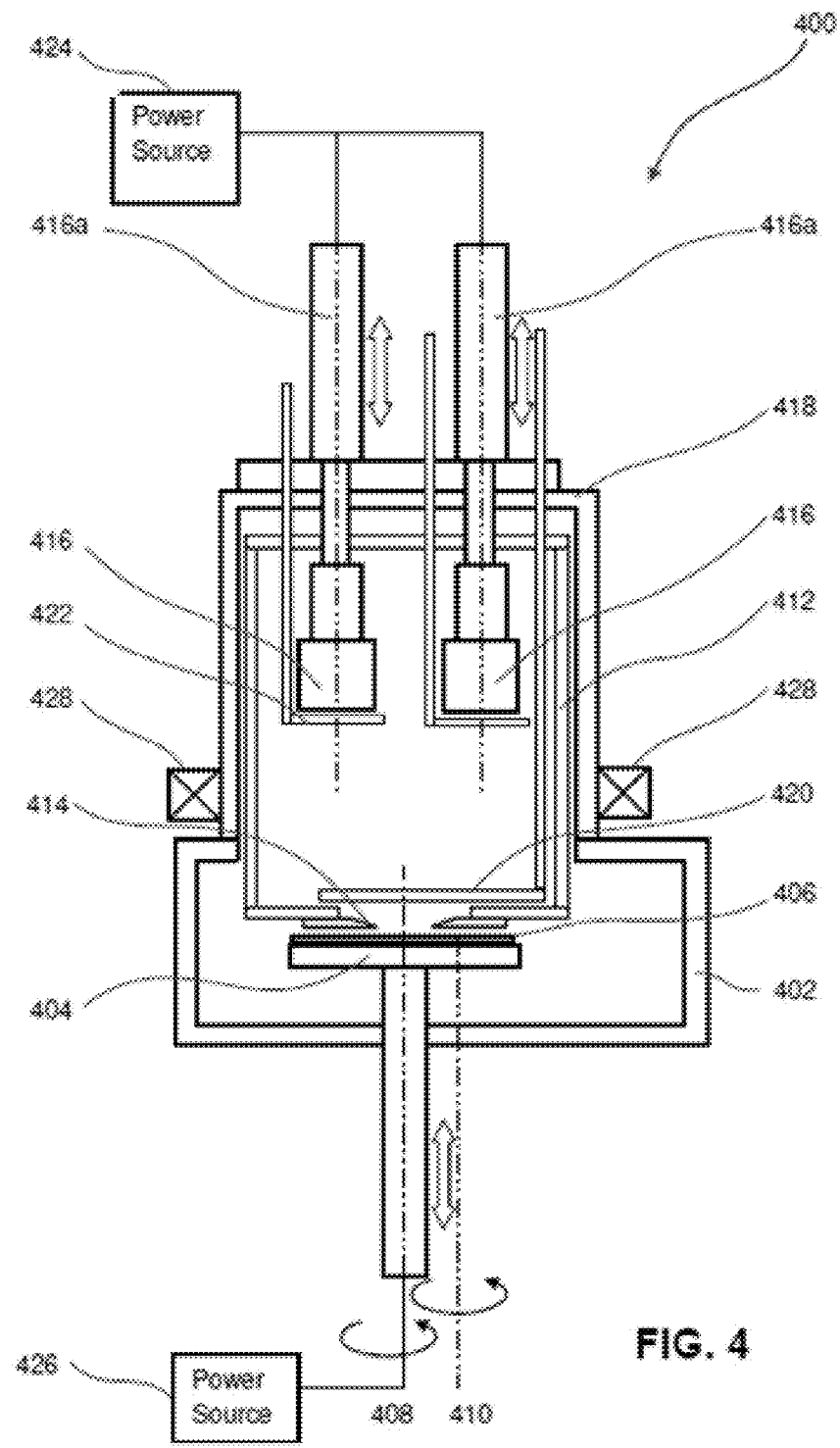
FIG. 4 is a simplified schematic diagram illustrating an exemplary sputter processing chamber according to some embodiments.

FIG. 4 is a simplified schematic diagram illustrating an exemplary process chamber 400 configured to perform combinatorial processing and full substrate processing in accordance with some embodiments of the invention. It will be appreciated that the processing chamber shown in FIG. 4 is merely exemplary and that other process or deposition chambers may be used with the invention. Further details on exemplary deposition chambers that can be used with the invention can be found in U.S. patent application Ser. No. 11/965,689, now U.S. Pat. No. 8,039,052, entitled "Multi-region Processing System and Heads", filed Dec. 27, 2007, and claiming priority to U.S. Provisional Application No. 60/970,500 filed on Sep. 6, 2007, and U.S. patent application Ser. No. 12/027,980, entitled "Combinatorial Process System", filed Feb. 7, 2008 and claiming priority to U.S. Provisional Application No. 60/969,955 filed on Sep. 5, 2007, the entireties of which are hereby incorporated by reference.

The processing chamber 400 includes a bottom chamber portion 402 disposed under a top chamber portion 418. A substrate support 404 is provided within the bottom chamber portion 402. The substrate support 404 is configured to hold a substrate 406 disposed thereon and can be any known substrate support, including but not limited to a vacuum chuck, electrostatic chuck or other known mechanisms.

The substrate 406 may be a conventional 200 mm and 300 mm wafers, or any other larger or smaller size. In some embodiments, substrate 406 may be a square, rectangular, or other shaped substrate. The substrate 406 may be a blanket substrate, a coupon (e.g., partial wafer), or even a patterned substrate having predefined regions. In some embodiments, substrate 406 may have regions defined through site-isolated processing as described herein.

The top chamber portion 418 of the chamber 400 includes a process kit shield 412, which defines a confinement region over a portion of the substrate 406. As shown in FIG. 4, the process kit shield 412 includes a sleeve having a base (optionally integrated with the shield) and an optional top. It will be appreciated, however, that the process kit shield 412 may have other configurations. The process kit shield 412 is configured to confine plasma generated in the chamber 400 by sputter guns 416. The positively-charged ions in the plasma strike a target and dislodge atoms from the target. The sputtered neutrals are deposited on an exposed surface of substrate 406. In some embodiments, the process kit shield 412 may be partially moved in and out of chamber 400, and, in other embodiments, the process kit shield 412 remains in the chamber for both full substrate and combinatorial processing. When used in the full substrate configuration, a gradient in the material properties can be introduced across the length and/or width of the substrate.

The base of process kit shield 412 includes an aperture 414 through which a surface of substrate 406 is exposed for deposition processing. The chamber may also include an aperture shutter 420 which is moveably disposed over the base of process kit shield 412. The aperture shutter 420 slides across a bottom surface of the base of process kit shield 412 in order to cover or expose aperture 414. In some embodiments, the aperture shutter 420 is controlled by an arm extension (not shown) which moves the aperture shutter to expose or cover aperture 414.

As shown in FIG. 4, the chamber 400 includes two sputter guns 416. While two sputter guns are illustrated, any number of sputter guns may be included, e.g., one, three, four or more sputter guns may be included. Where more than one sputter gun is included, the plurality of sputter guns may be referred to as a cluster of sputter guns. In addition, other sputter systems can be used, such as magnetron sputter systems.

The sputter guns 416 are moveable in a vertical direction so that one or both of the guns may be lifted from the slots of the shield. In some embodiments, sputter guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc. and the tilt angle may be varied.

The chamber may also include a gun shutter 422, which seals off the deposition gun when the process gun 416 is not needed during processing. The gun shutter 422 allows one or more of the sputter guns 416 to be isolated from certain processes as needed. It will be appreciated that the gun shutter 422 may be integrated with the top of the process kit shield 412 to cover the opening as the process gun 416 is lifted or individual gun shutter 422 can be used for each process gun 416.

The sputter guns 416 may be fixed to arm extensions 416a to vertically move sputter guns 416 toward or away from top chamber portion 418. The arm extensions 416a may be attached to a drive, e.g., lead screw, worm gear, etc. The arm extensions 416a may be pivotally affixed to sputter guns 416 to enable the sputter guns to tilt relative to a vertical axis. In some embodiments, sputter guns 416 tilt toward aperture 414 when performing combinatorial processing and tilt toward a periphery of the substrate being processed when performing full substrate processing. It will be appreciated that sputter guns 416 may alternatively tilt away from aperture 414.

The chamber 400 also includes power sources 424 and 426. Power source 424 provides power for sputter guns 416, and power source 426 provides RF power to bias the substrate support 404. In some embodiments, the output of the power source 426 is synchronized with the output of power source 424. The power source, 424, may output a direct current (DC) power supply, a direct current (DC) pulsed power supply, a radio frequency (RF) power supply or a DC-RF imposed power supply. The power sources 424 and 426 may be controlled by a controller (not shown) so that both deposition and etch can be performed in the chamber 400, as will be described in further detail hereinafter.

The chamber 400 may also include an auxiliary magnet 428 disposed around an external periphery of the chamber 400. The auxiliary magnet 428 is located between the bottom surface of sputter guns 416 and proximity of a substrate support 404. The auxiliary magnet may be positioned proximate to the substrate support 404, or, alternatively, integrated within the substrate support 404. The magnet 428 may be a permanent magnet or an electromagnet. In some embodiments, the auxiliary magnet 428 improves ion guidance as the magnetic field above substrate 406 is re-distributed or optimized to guide the metal ions. In some other embodiments, the auxiliary magnet 428 provides more uniform bombardment of ions and electrons to the substrate and improves the uniformity of the film being deposited.

The substrate support 404 is capable of both rotating around its own central axis 408 (referred to as "rotation" axis), and rotating around an exterior axis 410 (referred to as "revolution" axis). Such dual rotary substrate supports can be advantageous for combinatorial processing using site-isolated mechanisms. Other substrate supports, such as an XY table, can also be used for site-isolated deposition. In addition, substrate support 404 may move in a vertical direction. It will be appreciated that the rotation and movement in the vertical direction may be achieved through one or more known drive mechanisms, including, for example, magnetic drives, linear drives, worm screws, lead screws, differentially pumped rotary feeds, and the like.

Through the rotational movement of the process kit shield 412 and the corresponding aperture 414 in the base of the process kit shield, in combination with the rotational movement of substrate support 404, any region of a substrate 406 may be accessed for combinatorial processing. The dual rotary substrate support 404 allows any region (i.e., location or site) of the substrate 406 to be placed under the aperture 414; hence, site-isolated processing is possible at any location on the substrate 406. It will be appreciated that removal of the aperture 414 and aperture shutter 420 from the chamber 400 or away from the substrate 406 and enlarging the bottom opening of the process kit shield 412 allows for processing of the full substrate.

As described above, embodiments of the invention allow for both sputter deposition and plasma etch to be performed in the same process chamber (e.g., chamber 400). In some embodiments of the invention, the chamber 400 is configured so that both sputter deposition and plasma etch can be performed in the chamber 400, and, in particular, the chamber 400 is configured to allow for both site-isolated sputter deposition and plasma etch to be performed in the chamber. It will be appreciated that full wafer sputter deposition and plasma etch may also be performed in the chamber 400 by removing the aperture 414 away from the chamber 400 or moving the aperture 414 away from the substrate 406 and enlarging the bottom opening of the process kit shield 412.

In particular, plasma etch may be performed in the chamber 400 by applying RF power from the power source 426 to bias the substrate support (e.g., an electrostatic chuck) 404 with or without DC plasma near the sputter target. Plasma is then ignited on top of the substrate 406, which is confined by the aperture 414 and shield 412 above the substrate 406 so that site-isolated plasma etch of the substrate 406 can occur in the chamber 400. Sputter deposition may similarly be performed in the chamber 400 by applying DC power from the power source 424 to the sputter gun(s) 416. Three modes of processing can be performed in chamber 400: sputter deposition only, simultaneous sputter deposition and plasma etch, and plasma etch only.

In one embodiment, the RF power is any value or range of values between about 50 W and about 2000 W. In some embodiments, DC or pulsed DC power applied to sputter sources can have peak powers as high as 10 kW, for example, for high metal ionization in sputter deposition. The RF power frequency may be any value or range of values between about 40 kHz and about 60 MHz. It will be appreciated that the RF power frequency may be less than about 40 kHz or greater than about 60 MHz.

In chamber 400, plasma etch can be used to clean the substrate 406. An exemplary process according to some embodiments of the invention may begin by cleaning the substrate, performing site-isolated sputter deposition, performing site-isolated plasma etch, performing full substrate sputter deposition and then performing a subsequent full substrate plasma etch, all within the same chamber (e.g., chamber 400). Another exemplary process according to some embodiments of the invention may begin by cleaning the substrate, performing a full substrate sputter deposition, performing site-isolated sputter deposition, performing site-isolated plasma etch, performing full substrate sputter deposition, and performing a subsequent full substrate plasma etch, all within the same chamber (e.g., chamber 400). It will be appreciated that the above processes are merely exemplary and that processes according to the invention may include fewer steps or additional steps and that the order of the steps may vary.

Figure 5:
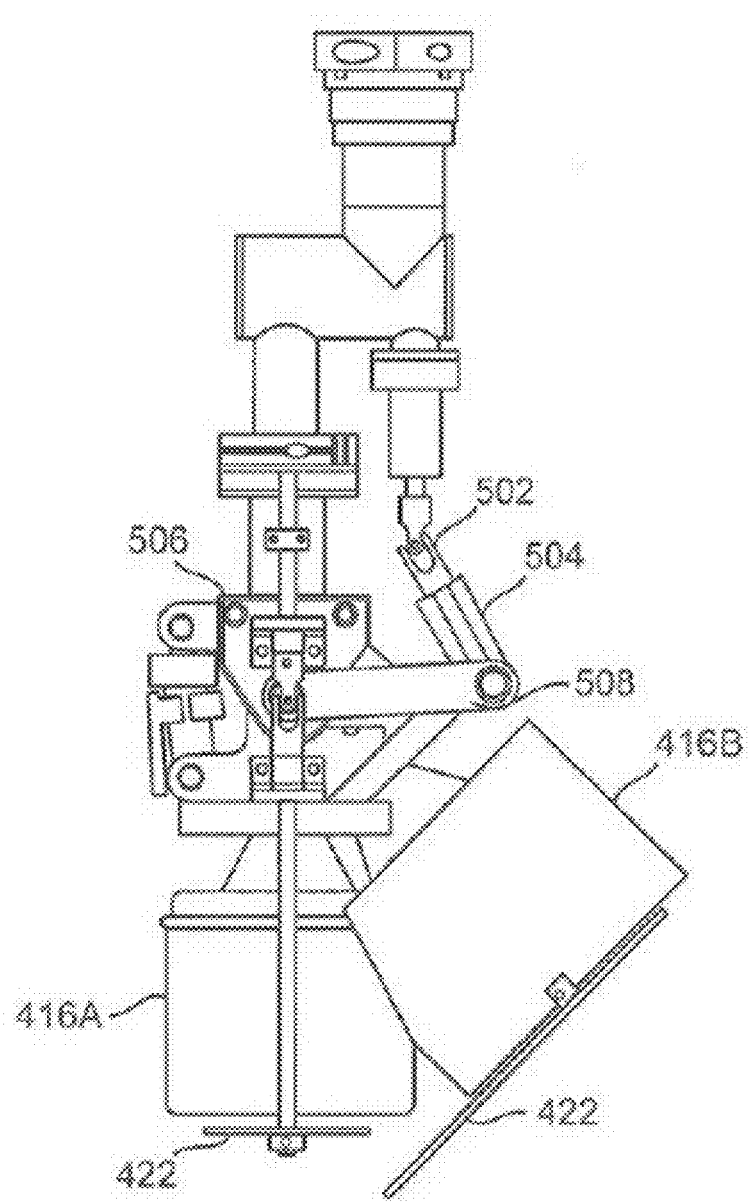
FIG. 5 is a simplified schematic diagram illustrating an exemplary deposition head with tilt capability according to some embodiments.

FIG. 5 is a schematic diagram illustrating a sputter gun having in-situ pivoting capabilities in accordance with some embodiments. Additional details of the sputter gun having in-situ pivoting capabilities are described in co-owned and co-pending U.S. patent application Ser. No. 13/725,133, filed on Dec. 21, 2012, which is herein incorporated by reference for all purposes. Sputter gun 416 is operable to be pivoted through a pivoting mechanism capable of operating in-situ without breaking vacuum within the chamber housing where sputter gun 416 is disposed. A motor contained within housing 506 is configured to drive pivot bar 508 in order to change the orientation of a target disposed on a bottom surface of sputter gun 416 between the two positions 416A and 416B of sputter gun 416 illustrated in FIG. 5. The motor within housing 506 is coupled to pivot bar 508, which in turn is coupled to lead screw 504. That is, the bottom surface of sputter gun 416 pivots around a pivot axis coupled to an arm extension supporting the sputter gun. As noted above, the arm extension supports the sputter gun lead screw 504 is coupled to U-joint 502. It should be appreciated that the motor is capable of functioning under high temperature and high vacuum processing conditions, and may be a magnetic drive, linear drive, worm screw, lead screw, a differentially pumped rotary feed through drive, etc., in some embodiments. Sputter gun 416 may be supported within the chamber in a known manner. Pivot angles and position of sputter gun 416 are controlled through a controller, such as controller 316 of FIG. 3. In some embodiments sputter gun 416 may be pivoted from 0 degrees to about 60 degrees relative to a normal axis of the target of sputter gun 416.

Figure 6:
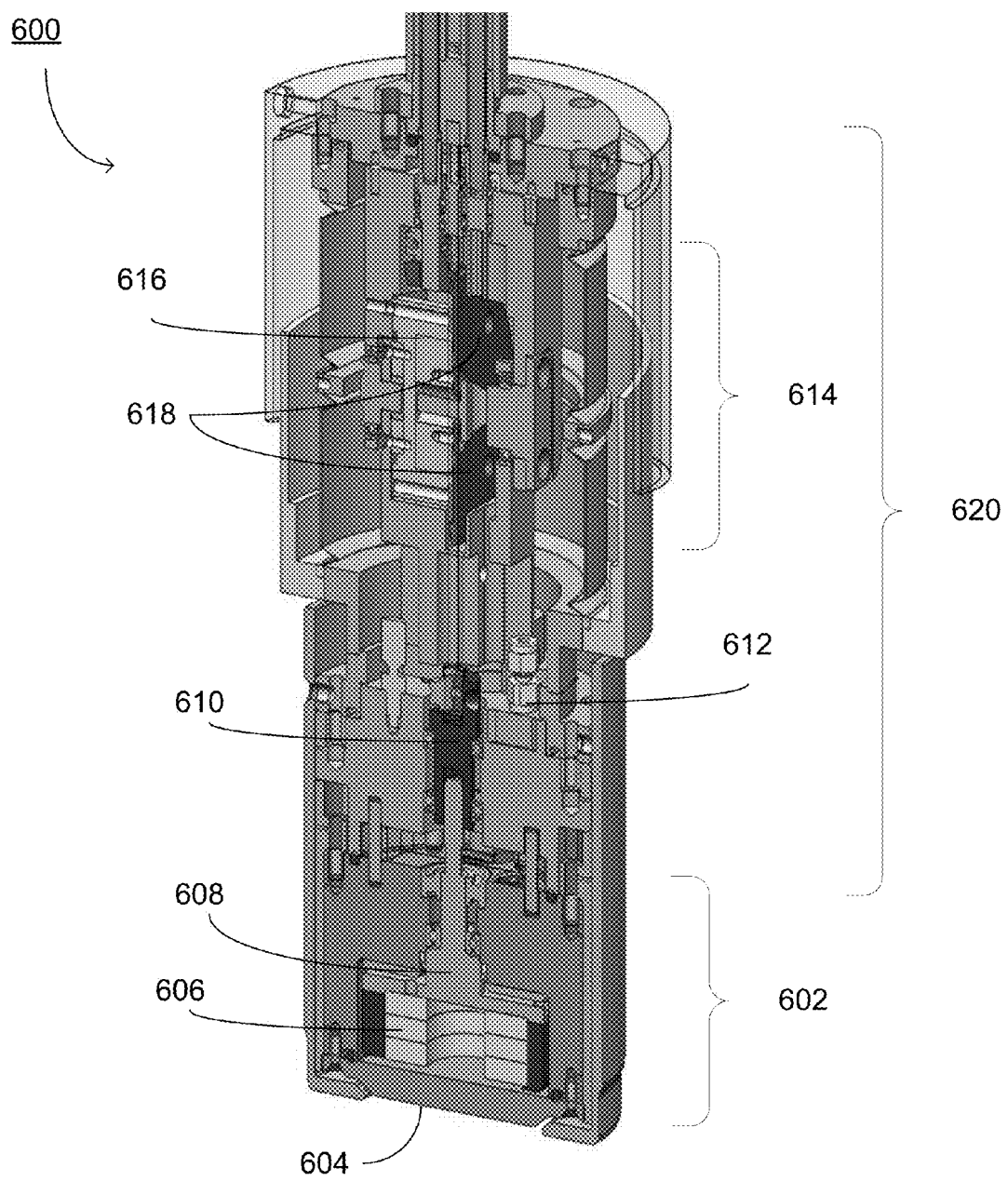
FIG. 6 is a simplified schematic diagram illustrating an exemplary deposition head according to some embodiments.

FIG. 6 is a simplified schematic diagram illustrating an exemplary deposition head according to some embodiments. Those skilled in the art will understand that the deposition head illustrated in FIG. 6 is one example of a more generic process head as discussed previously. The deposition head includes a removable assembly, 602, that can be changed to impart different functionality to the deposition head. Examples of different functionality include plasma treatment capability, ion beam treatment capability, and in-situ metrology. The deposition head includes a common assembly, 620, that serves as a base for the various removable assemblies. In the case of a deposition head, removable assembly, 602, will include hardware such as a target, 604, magnets, 606, and magnet rotation shaft, 608, and rotation assembly, 610. Connections, 612, are provided to supply cooling to the target and the lower portion of the deposition head. FIG. 6 is a simplified schematic diagram that illustrates the implementation of a target with a 3-inch diameter target assembly.

As discussed previously with respect to FIG. 5, the deposition head may be tilted within the process chamber using hardware assembly, 614. In operation, an external motor (or hand crank, not shown) can be used to rotate a drive shaft that turns a set of bevel gears that change the direction of the rotation. The gears may be housed in gear box, 616. The gears drive simple brackets, 618, that tilt the deposition head. The tilting of the deposition head may be accomplished without opening the process chamber. The titling capability allows the deposition head to directed in a number of angles.

Figure 7:
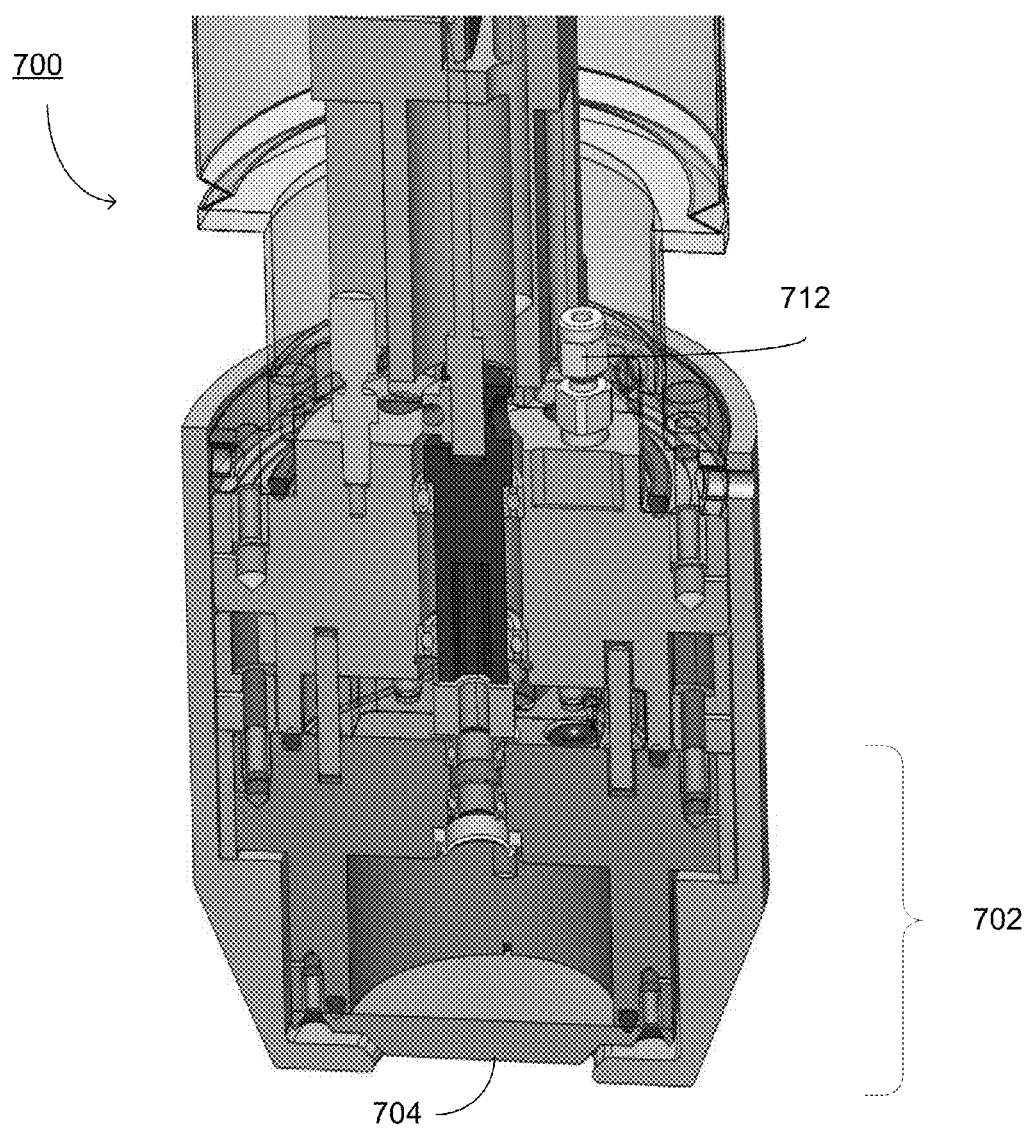
FIG. 7 is a simplified schematic diagram illustrating an exemplary deposition head according to some embodiments.

FIG. 7 is a simplified schematic diagram illustrating an exemplary deposition head according to some embodiments. Those skilled in the art will understand that the deposition head illustrated in FIG. 6 is one example of a more generic process head as discussed previously. The deposition head includes a removable assembly, 702, that can be changed to impart different functionality to the deposition head. Examples of different functionality include plasma treatment capability, ion beam treatment capability, and in-situ metrology. In the case of a deposition head, removable assembly, 702, will include hardware such as a target, 704. Connections, 712, are provided to supply cooling to the target and the lower portion of the deposition head. The magnets and rotation hardware as discussed with respect to FIG. 6 are not shown for clarity. FIG. 7 is a simplified schematic diagram that illustrates the implementation of a target with a 2-inch diameter target assembly.

In some embodiments, the lower sections of the process heads (e.g. 602 in FIGS. 6 and 702 in FIG. 7) are modular and are easily removed or exchanged to impart a new functionality to the process head. The modular design allows for increased flexibility to be designed into the process chamber to allow a wide variety of processes and process sequences to be evaluated. Further, the modular design allows the process chamber to be quickly changed to a new configuration without excessive downtime for the system.

Some embodiments of the invention are directed to combined processes being performed in one process chamber. The chamber may include multiple process heads. Additional details of the deposition and plasma processing capabilities are described in co-owned and co-pending U.S. patent application Ser. No. 13/804,265, filed on Mar. 14, 2013, which is herein incorporated by reference for all purposes. An aperture and a grounded shield are placed above the substrate to facilitate HPC processing. This shield may be moved out of the way to facilitate full wafer processing. The bottom of the aperture is flush with the bottom of the lower shield so that a small, constant dark-space gap is formed between the substrate and the aperture. A dielectric material may be used in the dark-space gap. The substrate is supported by a substrate support, such as an electrostatic chuck. A bias voltage can be applied to the substrate support, and plasma may be ignited with the one or more sputter guns while performing plasma processes (e.g. plasma etch or plasma surface treatment) in the chamber. The chamber is capable of performing both PVD sputter deposition and plasma processes, eliminating the need for a separate plasma chamber.

In some embodiments, a process chamber for combinatorial processing of a substrate is provided that includes one or more process heads (such as sputter guns, plasma treatments, ion beam treatments, or in-situ metrology). A power source may be coupled to the one or more heads. A substrate support; a power source (e.g. RF, DC, pulsed, or the like) coupled to the substrate support; and a grounded shield comprising an aperture disposed between the substrate support and the one or more process heads may be provided. The aperture may be configured to allow sputter deposition or plasma processing of a site-isolated region on the substrate.

In some embodiments, the entire surface of the substrate is exposed and the plasma processing (e.g. etching, nitridation, oxidation, and the like) can be applied uniformly to the entire surface of the substrate. In this configuration, the shielding and hardware discussed previously can be removed or transferred to a different location so that the entire surface of the substrate is exposed.

The results of the plasma (or ion beam) processing can be influenced by controlling one or more processing parameters such as gas flow ratio, gas flow composition (e.g. the concentration of reactive species such as $O_2$, $N_2$, F-sources, Cl-sources, $H_2$, etc.), substrate bias power, substrate bias frequency, processing time, substrate temperature, and the like. These processing parameters can be varied in a combinatorial manner across the various site-isolated regions on the surface of the substrate. By controlling one or more of these processing parameters, results such as etch rate and/or etch selectivity can be evaluated across the various site-isolated regions on the surface of the substrate if the plasma process is a plasma etch process. By controlling one or more of these processing parameters, results such as layer stoichiometry and/or surface treatment depth can be evaluated across the various site-isolated regions on the surface of the substrate if the plasma process is a plasma surface treatment process.

FIG. 8 presents a table of possible hardware configurations according to some embodiments. For convenience, four "process head positions" have been included. However, those skilled in the art will understand that the process chamber may include any number of process head positions. FIG. 8 lists eight examples of configurations for the process chamber. As an example, in Configuration #1, all four process head positions are occupied by a PVD (e.g. sputter) gun. In this configuration, all four targets may be the same material or each of the four targets may be a different material. The depositions may be performed sequentially to form layers or may be performed using co-sputtering to form intermixtures of the target materials. As is well known in the art, reactive sputtering may be employed to form compounds such as oxides, nitride, oxy-nitrides, and the like. This configuration allows flexibility in the deposition of a wide range of materials and/or layers.

As a second example, in Configuration #4, a process head with in-situ metrology functionality has been installed in Process Head Position #2. Examples of in-situ metrology functionality include the ability to measure thickness, reflectivity, film composition, etc. A process head with ion beam treatment functionality has been installed in Process Head Position #3. A process head with plasma treatment functionality has been installed in Process Head Position #4. The Configuration #4 would allow plasma treatment before or during the deposition of a material. As an example, a plasma treatment could be used to clean or pre-treat the surface of the substrate to modify the interface formed between the substrate and the deposited material. The Configuration #4 would allow ion beam treatment before or during the deposition of a material. As an example, an ion beam treatment during the deposition could be used to influence properties such as the density or morphology of the deposited material. The Configuration #4 would allow in-situ metrology measurements to be performed between any of the processes described previously.

Those skilled in the art will understand the possible scenarios indicated by the various examples of configurations listed in FIG. 8 without each configuration being discussed in detail. Further, those skilled in the art will understand that there are other configurations that may be possible. The current disclosure discusses examples of apparatus that enable the timely and efficient reconfiguration of a process chamber to allow a wide variety of process sequences.

Figure 9:
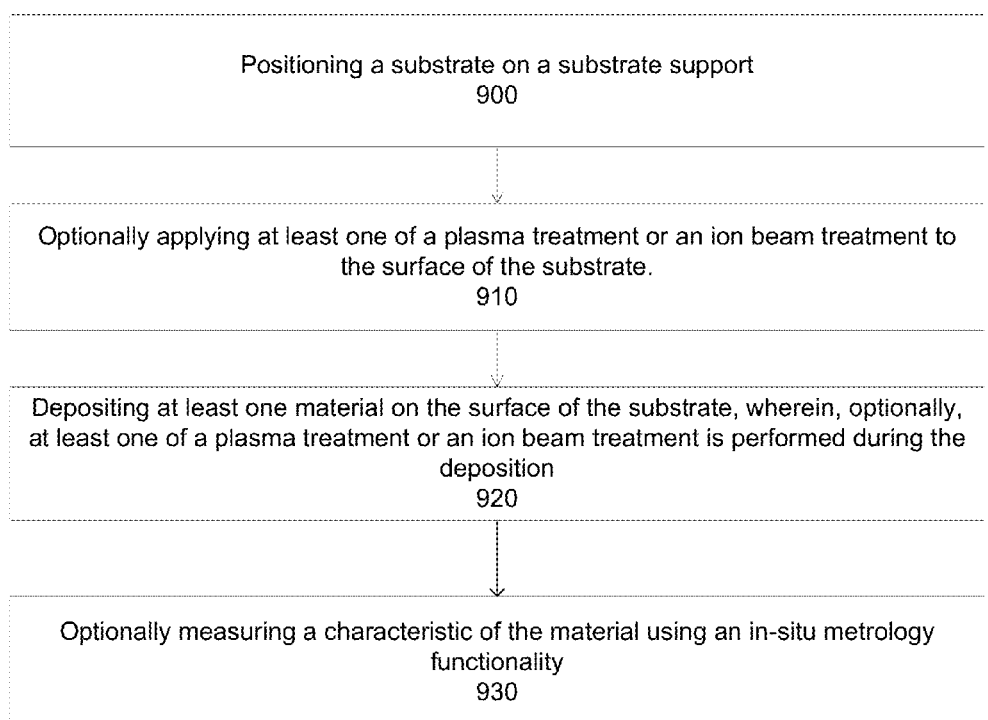
FIG. 9 illustrates an exemplary flowchart for processing a substrate according to some embodiments.

FIG. 9 illustrates an exemplary flowchart for processing a substrate according to some embodiments. Operation 900 positions a substrate on a substrate support. The substrate support is preferably disposed in a vacuum process chamber. The substrate support can be an electrostatic chuck (ESC) or other suitable substrate holder configuration. The substrate support preferably comprises a conductive material for acting as an electrode for a bias voltage source.

Operation 910 includes an optional step wherein at least one of a plasma treatment or an ion beam treatment is applied to the surface of the substrate. As discussed previously, the plasma treatment process may be one of nitridation, oxidation, fluorination, chlorination, or hydrogen treatment. As discussed previously with respect to FIG. 8, this step will depend on the details of the configuration of the process chamber.

Operation 920 includes a step wherein at least one material is deposited on the surface of the substrate. As discussed previously, the material may be a single material, a number of layers, or a co-sputtered material. Also in operation 920, at least one of a plasma treatment or an ion beam treatment is optionally applied to the surface of the substrate during the deposition. As discussed previously, the plasma treatment process may be one of nitridation, oxidation, fluorination, chlorination, or hydrogen treatment. As discussed previously with respect to FIG. 8, this step will depend on the details of the configuration of the process chamber.

Operation 930 includes an optional step wherein at least one characteristic of the material is measured on the surface of the substrate using an in-situ metrology functionality. Examples of in-situ metrology functionality include the ability to measure thickness, reflectivity, film composition, etc.

Figure 10:
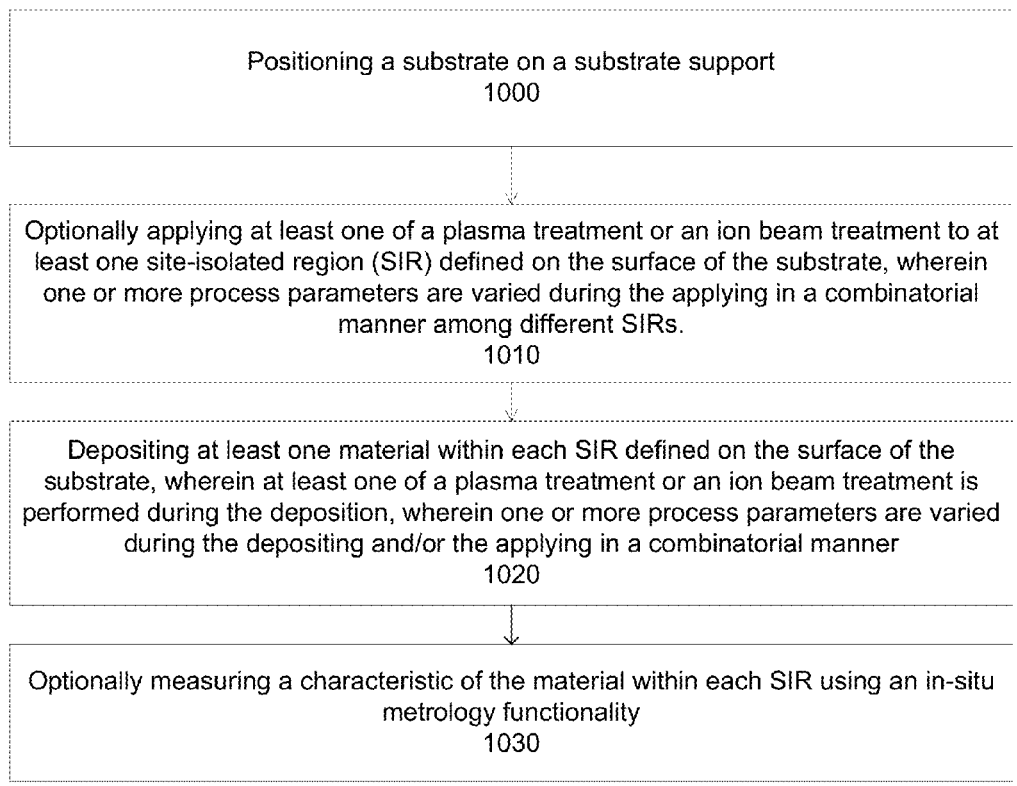
FIG. 10 illustrates an exemplary flowchart for processing a substrate according to some embodiments.

FIG. 10 illustrates an exemplary flowchart for processing a substrate according to some embodiments. Operation 1000 positions a substrate on a substrate support. The substrate support is preferably disposed in a vacuum process chamber. The substrate support can be an electrostatic chuck (ESC) or other suitable substrate holder configuration. The substrate support preferably comprises a conductive material for acting as an electrode for a bias voltage source.

Operation 1010 includes an optional step wherein at least one of a plasma treatment or an ion beam treatment is applied to at least one site-isolated region (SIR) defined on the surface of the substrate. As discussed previously, the plasma treatment process may be one of nitridation, oxidation, fluorination, chlorination, or hydrogen treatment. Typically, there will be a plurality of SIRs available for processing. If the optional step of applying at least one of a plasma treatment or an ion beam treatment is employed, then at least one process parameter is varied between the SIRs in a combinatorial manner as discussed previously. As discussed previously with respect to FIG. 8, this step will depend on the details of the configuration of the process chamber.

Operation 1020 includes a step wherein at least one material is deposited on at least one SIR defined on the surface of the substrate. Typically, at least one process parameter is varied between the SIRs in a combinatorial manner during the deposition as discussed previously. As discussed previously, the material may be a single material, a number of layers, or a co-sputtered material. Also in operation 1020, at least one of a plasma treatment or an ion beam treatment is optionally applied to the surface of the substrate during the deposition. As discussed previously, the plasma treatment process may be one of nitridation, oxidation, fluorination, chlorination, or hydrogen treatment. If the optional step of applying at least one of a plasma treatment or an ion beam treatment is employed, then at least one process parameter is varied between the SIRs in a combinatorial manner as discussed previously. As discussed previously with respect to FIG. 8, this step will depend on the details of the configuration of the process chamber.

Operation 1030 includes an optional step wherein at least one characteristic of the material is measured within each SIR defined on the surface of the substrate using an in-situ metrology functionality. Examples of in-situ metrology functionality include the ability to measure thickness, reflectivity, film composition, etc.

The invention has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. An apparatus comprising:
    a process chamber; and
    four process heads disposed within the process chamber, wherein a first process head is operable to deposit a material on the substrate, a second process head is operable to apply a plasma treatment on the substrate, a third process head is operable to apply an ion beam treatment on the substrate, and wherein the fourth process head has in-situ metrology functionality,
    wherein each of the four process heads comprises a common assembly and a removable assembly removably connected to the common assembly, the removable assembly of each of the four process heads is configured to determine the functionality of the respective process head, and the removable assembly of each of the four process heads is configured to be removably connected to the common assembly of each of the four process heads.

2. The apparatus of claim 1 wherein the plasma treatment process is one of plasma etch or plasma surface treatment.

3. The apparatus of claim 2 wherein the plasma treatment process is one of nitridation, oxidation, fluorination, chlorination, or hydrogen treatment.

4. The apparatus of claim 1 wherein the in-situ metrology functionality measures one of thickness, reflectivity, or film composition.

5. The apparatus of claim 1 wherein the deposition process comprises a PVD (sputtering) technique.

6. A method for processing a substrate, the method comprising:

positioning a substrate on a substrate support in a process chamber, wherein the process chamber comprises four process heads, wherein a first process head is operable to deposit a material on the substrate, a second process head is operable to apply a plasma treatment on the substrate, a third process head is operable to apply an ion beam treatment on the substrate, and a fourth process head has in-situ metrology functionality, and wherein each of the four process heads comprises a common assembly and a removable assembly removably connected to the common assembly, the removable assembly of each of the four process heads is configured to determine the functionality of the respective process head, and the removable assembly of each of the four process heads is configured to be removably connected to the common assembly of each of the four process heads;

applying a plasma treatment process to the substrate with the second process head; and after the applying, depositing a material on the substrate with the first process head.

7. The method of claim 6 wherein the plasma treatment process is one of nitridation, oxidation, fluorination, chlorination, or hydrogen treatment.

8. The method of claim 6 further comprising applying an ion beam treatment with the third process head during the depositing.

9. The method of claim 6 further comprising applying a plasma treatment with the second process head during the depositing.

10. The method of claim 6 further comprising measuring a characteristic of the material with the fourth process head.

11. The method of claim 10 wherein the characteristic of the material is one of thickness, reflectivity, or film composition.

12. The method of claim 6 wherein the deposition process comprises a PVD (sputtering) technique.

* * * * *